United States Patent

Seevinck et al.

[11] Patent Number: 5,329,481
[45] Date of Patent: Jul. 12, 1994

[54] SEMICONDUCTOR DEVICE HAVING A MEMORY CELL

[75] Inventors: Evert Seevinck; Maarten Vertregt; Godefridus A. M. Hurkx, all of Eindhoven, Netherlands

[73] Assignee: U.S. Philips Corporation, New York, N.Y.

[21] Appl. No.: 989,629

[22] Filed: Dec. 14, 1992

[30] Foreign Application Priority Data

Dec. 16, 1991 [EP] European Pat. Off. ......... 91203305.7

[51] Int. Cl.$^5$ ............................................. G11C 11/34
[52] U.S. Cl. ..................................... 365/177; 365/174
[58] Field of Search ............... 365/174, 177, 189.01; 257/378, 370

[56] References Cited

U.S. PATENT DOCUMENTS 4,090,254  5/1978  Ho et al. ........................ 365/177
5,060,194  10/1991  Sakui et al. ................... 365/177

FOREIGN PATENT DOCUMENTS 359112642  6/1984  Japan ............................ 257/378

Primary Examiner—Eugene R. LaRoche
Assistant Examiner—Son Dinh
Attorney, Agent, or Firm—Steven R. Biren

[57] ABSTRACT

A semiconductor device with at least one programmable memory cell which includes a bipolar transistor ($T_1$) with an emitter (11) and a collector (12) of a first conductivity type and a base (10) of a second, opposite conductivity type. The emitter (11) and collector (12) are coupled to a first supply line (100) and a second supply line (200), respectively. The base (10) is coupled to writing means (WRITE) through a control transistor ($T_2$). Reading means (READ) are included in a current path (I) which extends between the first supply line (100) and the second supply line (200) and which includes a current path between the emitter (11) and collector (12). In a preferred embodiment, the collector (12) is in addition coupled to the second supply line (200) via a switchable load ($T_5$).

6 Claims, 2 Drawing Sheets

SEMICONDUCTOR DEVICE HAVING A MEMORY CELL

BACKGROUND OF THE INVENTION

The invention relates to a semiconductor device comprising a semiconductor body provided with a programmable memory cell which comprises a bipolar transistor with an emitter and a collector of a first conductivity type mutually separated by a base of a second, opposite conductivity type, the emitter and the collector being coupled to a first and a second supply line, respectively, while the base is coupled to writing means through at least a control transistor provided with a control electrode.

Such a device is known from the Technical Digest of the International Devices Meeting 1988, pp. 44–47. The known memory cell comprises a vertical bipolar transistor with an n-type emitter and collector and a p-type base. The emitter and collector of the known memory cell are directly connected to a first and a second supply line, respectively, between which a constant potential difference of approximately 6 V is maintained during operation. The base is coupled to both reading and writing means through a PMOS transistor and a combined read/write line.

The operation of the known memory cell is based on the principle that electrons injected into the base are capable of freeing electrons around the base-collector junction and thus creating new free charge carriers. The charge carriers thus generated are then pulled away to either side of the depletion region under the influence of the prevailing electric field, thus providing an additional base current opposite to the base current externally supplied through the PMOS transistor.

When the base-emitter voltage ($V_{BE}$) is sufficiently high, the additional base current gets the upper hand and the bipolar transistor continues to pass current, even if the external base current should drop out. The base-emitter voltage then remains at approximately 1 V. If only a comparatively low emitter-base voltage is applied, however, the externally supplied base current is the greater and the bipolar transistor will be cut off the moment the connection with the base is broken. The base-emitter voltage in that case is approximately 0 V. It is possible by applying a suitable potential to the base through the PMOS transistor to write the known cell into one of the two states, corresponding to a logic "1" or "0". To read out the actual memory state of a memory cell, the base-emitter voltage is detected in the known memory cell in a similar manner through the PMOS transistor and the combined read/write line.

The known device has the disadvantage that reading out of the memory cell takes place comparatively slowly. The combined read/write line and the circuit elements possibly coupled thereto in fact inevitably constitute a certain parasitic capacitance. When a memory cell is read, this capacitance must be completely charged before the base voltage appears at the read-/write line. Since only a comparatively low base current serves as the charging current in the known device, reading of the known memory cell is comparatively slow.

SUMMARY OF THE INVENTION

The invention has for its object inter alia to provide a semiconductor device with a memory cell whose instantaneous memory state can be read out more quickly during operation.

According to the invention, a semiconductor device of the kind mentioned in the opening paragraph is for this purpose characterized in that the memory cell is coupled to reading means which are included in a current path which extends between the first and the second supply line and which comprises a current path between the emitter and the collector of the transistor.

In contrast to the known device, the memory cell according to the invention is read not at the base but at the emitter or collector. The invention is based on the recognition that the memory state of the memory cell may alternatively be determined at the emitter and the collector. A collector current is available there which is considerably greater than the base current as a result of the amplification factor of the transistor. Any parasitic capacitance coupled to the reading means in the device according to the invention therefore exerts a much lesser influence on the reading speed than in the known device.

Preferably, the reading means are connected between the emitter and the first supply line. Positioning of the reading means in the current path from the emitter to the second supply line has the advantage that the emitter potential has an offset relative to the first supply line as a result of the impedance or other characteristics of this second supply line, so that the voltage of the first supply line can be used for writing the cell, and no additional supply line is required.

The known device has the further disadvantage that the memory cell consumes a comparatively high power during operation. Programmed in a logic "1" state, the bipolar transistor of the known memory cell carries a current of approximately 0.1 mA, which implies a power consumption of 0.6 mW per memory cell at an emitter-collector voltage of 6 V. This means that the known device cannot very well be used in larger memories comprising, for example, one million memory cells, which would require a total power of approximately 600 W if based on the known cell.

A preferred embodiment of the device according to the invention counteracts this disadvantage and is characterized in that the collector is coupled to the second supply line through a switchable load, and in that the load is provided with switching means for switching the load between a comparatively high and a comparatively low value. The switchable load may in that case be switched to a high level as long as the information contents of the cell need only be stored. The collector current, and therefore the power consumption of the cell, are comparatively low in that case for both memory states. The moment the memory cell is addressed for being read, however, the load may be switched to a comparatively low level, so that at least for one of the two memory states the collector current switches to a high level and a high reading speed can be achieved. The power consumption of the memory cell according to the invention can thus be considerably reduced in comparison with the known memory cell without adversely affecting the reading speed of the cell.

Such a switchable load may be formed, for example, by a first resistor of the desired high value connected in parallel to a transistor which may or may not be in series with a second resistor of the desired low value. In that case, the load is switched back from the high value of the first resistor to practically the low value of the second resistor in that the transistor is switched on. In a further preferred embodiment of the device according to the invention, however, the switchable load is formed by a field effect transistor having a source and a drain between which the electric conductivity is controllable by means of a gate electrode, and in that the gate electrode forms the switching means. The transistor may be switched to the desired high-ohmic state by the application of a control voltage to the gate electrode which has an absolute value of the order of or lower than the threshold voltage of the transistor. The transistor then carries only a slight sub-threshold current and has a high impedance. This current in practice is found to be sufficient for maintaining the memory state of the memory cell. When a control voltage having an absolute value well above the threshold voltage is applied, however, the transistor switches to the desired low impedance and the cell may be read out at a comparatively high speed. Not only is the switchable load constructed in a very compact manner in this way and can be readily integrated into a semiconductor body together with the memory cell, but a load in the form of a field effect transistor has in addition a wider breakdown margin than an ohmic resistor because of its non-linear resistance characteristic.

The presence of the switchable load between the first supply line and the collector renders it possible in addition to use the cell in a memory matrix in a compact manner. A special embodiment of the device according to the invention comprises such a memory matrix and is for this purpose characterized in that the device comprises besides the memory cell a number of similar further memory cells, which memory cells are organized in a memory matrix comprising rows and columns, in that the collectors of the cells within a row are coupled to the second supply line through a common load, in that the switching means of the common load of a row of memory cells are coupled to a first read selection line, in that the emitters of the memory cells within a column are coupled to a second read selection line, and in that the read selection line is coupled to reading means which are common to a column of memory cells. Although the memory cells within a column are thus coupled to the same, common reading means, discrimination between different rows is nevertheless possible owing to the switchable load according to the invention. This will be further clarified with reference to a Figure in the further explanation of the invention below.

To write the memory cells within the memory matrix, a further embodiment of the device according to the invention is characterized in that the memory matrix comprises separate write selection lines, in that the control electrodes of the control transistors within a row of memory cells are coupled to a first write selection line, and in that the bases of the memory cells within a column of memory cells are coupled to a second write selection line and to common writing means. To prevent the states of the other cells within the same row being changed when a memory cell is written, and at the same time to refresh the information within that row, according to a preferred embodiment, the device according to the invention is further characterized in that the second read selection line has a feedback line to the second write selection line within a column of memory cells.

BRIEF DESCRIPTION OF THE DRAWINGS

The invention will now be explained in more detail with reference to the drawing, in which.

The Figures are purely diagrammatic and not drawn to scale. Some dimensions in particular are depicted on a strongly exaggerated scale for greater clarity. Corresponding parts are generally given the same reference numerals.

DESCRIPTION OF THE PREFERRED EMBODIMENTS

Figure 1:
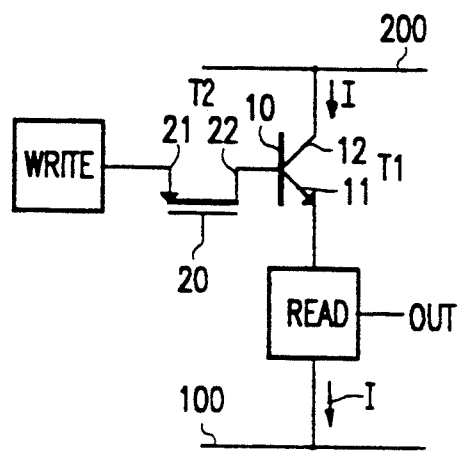
FIG. 1 is an equivalent circuit diagram of an embodiment of the device according to the invention.

FIG. 1 shows an equivalent circuit diagram of an embodiment of the device according to the invention. In this case the memory cell comprises a bipolar transistor $T_1$ with a p-type base 10 and an n-type emitter 11 and collector 12. The emitter 11 and collector 12 are coupled to a first supply line 100 and a second supply line 200, respectively. During operation, the first supply line 100 is connected to ground, while a constant voltage of approximately 5 V is present at the second supply line. The base 10 of the transistor $T_1$ is connected to one of the main electrodes 21, 22 of a control transistor $T_2$, in this case the drain 22 of a p-channel MOS transistor. The source 21 of the control transistor $T_2$ is connected to writing means (WRITE) which are known per se and which are therefore depicted only diagrammatically. The base 10 may be switchably connected to the writing means (WRITE) by applying the appropriate voltage to the gate electrode 20 of the field effect transistor.

Figure 2:
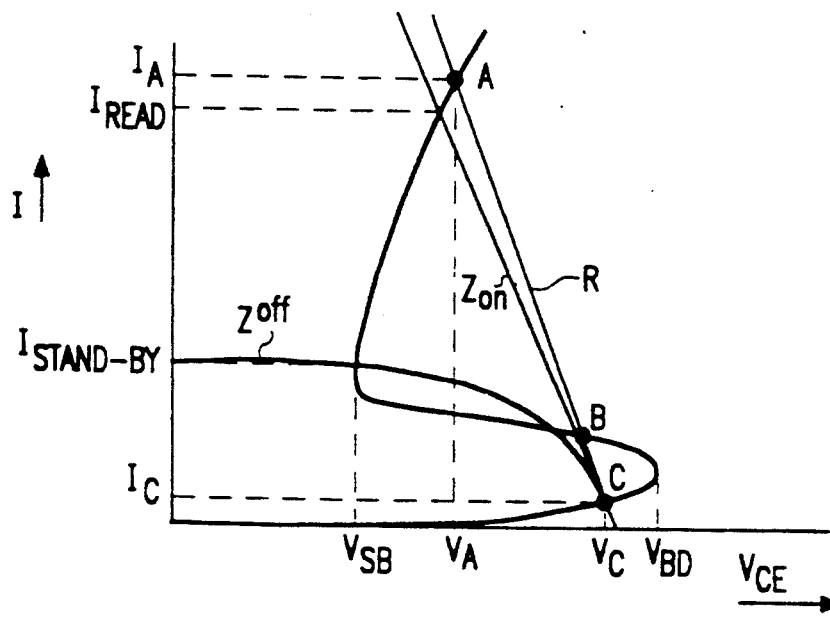
FIG. 2 shows the change in the collector current as a function of the emitter-collector voltage at an open base for the device of FIG. 1.

In the case of an open base, i.e. with non-conducting control transistor, the bipolar transistor $T_1$ of the memory cell described here exhibits the relationship shown in FIG. 2 between the emitter-collector voltage $T_{CE}$ and the collector current I. At a low emitter-collector voltage, the current hardly rises initially with an increasing emitter-collector voltage. When the emitter-collector voltage exceeds a certain value $V_{BD}$, however, the minority charge carriers in the base have such a high energy that they are capable of detaching additional charge carriers. Given a sufficient energy transfer, the detached charge carriers in their turn are also capable of detaching even more free charge carriers. The collector current strongly increases as a result of this avalanche effect and the emitter-collector voltage collapses to a value $V_{SB}$. From that point the collector current rises steeply with increasing emitter-collector voltage.

FIG. 2 also shows the resistance characteristic R which is connected with the series load of the transistor $T_1$. This load comprises inter alia the resistance of the electrical connections from and to the emitter and collector. As a result of this load, there are only three discrete states in which the system can find itself. These states correspond to the points of intersection A, B, C of the two characteristics. States A and C only are stable. State B is unstable in that the slightest disturbance of this state will cause the system to switch immediately to one of the stable states. During operation, therefore, the memory cell will be in state A or in state C, corresponding to a logic "1" and a logic "0", respectively.

The memory cell may be programmed for either of the two stable states by the writing means (WRITE) and the control transistor $T_2$. If a voltage differential of substantially 0 V is applied between the base 10 and the emitter 11, the cell is forced into state C; at a higher emitter-base voltage of, for example, approximately 1 V, on the other hand, the cell will enter the other stable state A. The desired potential difference relative to the emitter 11 is generated by the writing means (WRITE) and transmitted to the base 10 through the control transistor $T_2$. When subsequently the connection with the base 10 is broken by the control transistor $T_2$, the cell remains in the programmed state, corresponding to an emitter-base voltage of approximately 1 V for state A and approximately 0 V for state C.

The memory cell in the known device is read out by means of a determination of the instantaneous base-emitter voltage through reading means, which in the known device are also coupled to the base 10 through the control transistor $T_2$. A disadvantage of this, however, is that the base-emitter voltage must be transmitted to the reading means, which inevitably means that the parasitic capacitance coupled thereto must be charged from the base 10. This takes comparatively much time because of the comparatively small base current which serves as a charging current.

A considerably higher reading speed can be achieved with the device according to the invention. For this purpose, according to the invention, reading means (READ) are included in a current path between the first supply line 100 and the second supply line 200, comprising the current path between the emitter 11 and collector 12 and indicated diagrammatically with an arrow I in FIG. 1. The present invention is based on the recognition that the memory state of the cell can be detected not only at the base but also at the emitter 11 and collector 12, where a considerably greater reading current is present owing to the amplification factor of the transistor $T_1$. The amplification factor of the transistor $T_1$ in this example is approximately 50, so that the detected current I is approximately 50 times greater than the base current of the transistor. The reading speed of the transistor as a result is less strongly delayed by parasitic capacitances by approximately a factor 50 compared with the known memory cell. Indeed, by using modern growing and doping techniques, such as molecular beam epitaxy (MBE) and delta doping, substantially higher amplification factors of the order of 1000 can be realized, so that the advantage of the invention is even more enhanced.

As is evident from FIG. 2, the two memory states A and C correspond to a collector current I and an emitter-collector voltage $V_{CE}$ of $I_A$ and $V_A$ and of $I_C$ and $V_C$, respectively. In the device according to the invention, the instantaneous memory state is determined from these values by the reading means (READ), and can be derived at an output (OUT) of these means.

No special requirements are imposed on the reading means per se, and their practical implementation accordingly lies within the scope of the average skilled person. In particular, the reading means may be included in the current path I both at the emitter and at the collector side, as required. It is preferable, however, to position the reading means between the emitter 11 and the first supply line 100, as in the present case. The impedance of the reading means (READ) in that case ensure that the potential of the emitter 11 is lifted to above the level of the first supply line 100. The potential of the first supply line 100 may then be simply used for applying an emitter-base voltage of substantially 0 V with the writing means (WRITE), no additional supply line having a lower potential being required.

Figure 3:
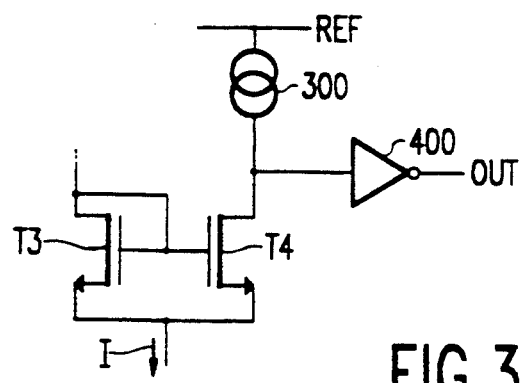
FIG. 3 is equivalent circuit diagram of an embodiment of reading means which can be used in the device of FIG. 1.

FIG. 3 shows a preferred embodiment of the reading means (READ) comprising a current mirror and two PMOS transistors $T_3$, $T_4$ in combination with a current comparator comprising a reference current source 300 and an inverter circuit 400. The reference current source here carries a reference current during operation which is approximately half the reading current I when the cell is programmed for a logic "1". The reading means are capable of converting the reading current I into a voltage which appears at the output OUT of the inverter circuit. Preferably, the transistor $T_3$ of the reading means included in the current path I is constructed so as to have practically the same threshold voltage as the control transistor $T_2$ of the memory cell. In that case, in fact, the same voltage drop occurs in the reading means as the inevitable voltage drop across the control transistor $T_2$. As described in the preceding paragraph, it remains possible then to use only the first supply line for applying a base-emitter voltage of approximately 0 V.

Figure 4:
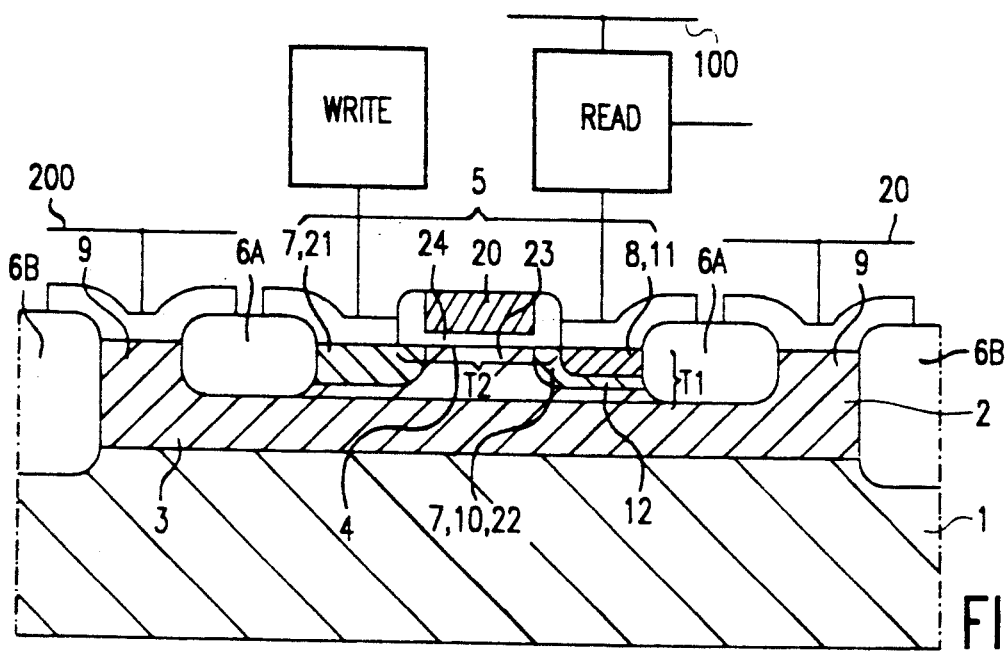
FIG. 4 is a cross-section of an embodiment of the device of FIG. 1 integrated in a semiconductor body.

The circuit of FIG. 1 may be integrated in a semiconductor body in a very compact manner as shown in cross-section in FIG. 4. Semiconductor regions of the same conductivity type are hatched in the same direction in the Figure. This embodiment of the device comprises a p-type semiconductor substrate 1 of silicon on which an n-type silicon layer 2 is provided, for example, by epitaxial growth. A comparatively heavily doped buried layer 3 lies at an interface between the substrate and the silicon layer.

The silicon layer 2 comprises, at a surface 4 thereof, an island 5 which is surrounded by a partly recessed silicon oxide layer 6A. Two p-type surface zones 7 are provided in the island 5, forming the source 21 and the drain 22 of the MOS transistor $T_2$ and mutually separated by a portion of the island 5, which forms a channel region 23. The channel region is covered by a comparatively thin silicon oxide layer 24 by means of which a superimposed gate electrode 20 of the channel region 23 is electrically insulated.

The drain 22 of the control transistor $T_2$ also forms the base 10 of the bipolar transistor $T_1$ and is provided with an n-type surface zone 8 which forms the emitter 11 of the transistor. The emitter 11 is coupled to the first supply line 100 through reading means (READ). The electric wiring 100, 200 and the writing and reading means (WRITE, READ) are depicted only diagrammatically in the Figure for reasons of clarity. In actual fact, the various components of the wiring are formed, for example, by conductor tracks made of a metal (compound) or a doped semiconductor material and running over the surface, or by doped semiconductor regions provided in the semiconductor body. The base 10 of the transistor $T_1$ is connected to the writing means (WRITE) through the MOS transistor. The MOS transistor may be switched on or off by means of the gate electrode 20, and the base 10 of the bipolar transistor can accordingly be connected to or disconnected from the writing means, respectively.

The n-type island forms not only the channel region 23 of the MOS transistor $T_2$, but also the collector 12 of the bipolar transistor $T_1$. This integration of the two transistors with one another saves space and renders a very compact structure possible. Outside the island 5, a collector contact zone 9 is provided by means of which the collector 12 is connected through the buried layer 3 and is coupled to the second supply line 200. The collector contact zone 9 is limited by a further, partly recessed silicon oxide layer 6B, which in contrast to the first layer 6A extends throughout the entire silicon layer 2 down to the substrate 1.

Figure 5:
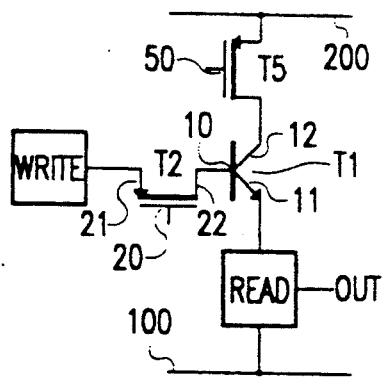
FIG. 5 is an equivalent circuit diagram of a preferred embodiment of the device according to the invention.

FIG. 5 shows an equivalent circuit diagram of a preferred embodiment of the device according to the invention. In this case, a switchable load is provided between the collector 12 of the bipolar transistor $T_1$ and the second supply line 200, which load can be switched between a comparatively high and a comparatively low impedance. The switchable load in this embodiment is formed by a p-channel MOS transistor (PMOST) $T_5$, which together with the memory cell can be integrated in a semiconductor body. The load is switched to a high impedance when a control voltage of the order of or smaller than the threshold voltage of the load transistor $T_5$ is applied to the gate electrode 50. The transistor $T_5$ then has an impedance of the order of a few $G\Omega$ and carries only a small sub-threshold current $I_{STAND-BY}$ smaller than 1 nA, which, however, is sufficient for maintaining the memory state of the cell. FIG. 2 shows the resistance characteristic of the PMOST $T_5$ in this state diagrammatically by means of the curve $Z_{OFF}$. The power consumption of the cell is low in that case.

For reading the cell, a low voltage is applied to the gate electrode 50 of the transistor $T_5$, so that the transistor becomes conducting and attains the desired low impedance, so that a high collector current $I_{READ}$ of a few hundreds of $\mu A$ and a high reading speed are obtained. Curve $Z_{ON}$ indicates the resistance characteristic of the MOST $T_5$ in this state. The memory cell of this embodiment thus combines a low standby current with a high reading speed.

Such a switchable load may indeed also be formed, for example, by a first resistor of the desired high value connected in parallel to a transistor, which is possibly in series with a second resistor of the desired low value. When the transistor is switched on in that case, the high load value of the first resistor is switched back to substantially the low value of the second resistor. The switchable load of this example has the advantage, however, that a comparatively high impedance can be realized on a comparatively small surface area, so that the load can be easily integrated with the memory cell. The non-linear resistance characteristic $Z_{OFF}$ of the field effect transistor in addition provides a wider breakdown margin as compared with a linear, ohmic resistor. In the high-ohmic state, a slight disturbance of a linear characteristic may already be sufficient for causing a logic "1" to be lost. This is because there is no point of intersection in common any more with the steep portion of the curve of the memory cell when the linear characteristic becomes too level. A non-linear load renders the memory cell much less sensitive to such an information loss.

Figure 6:
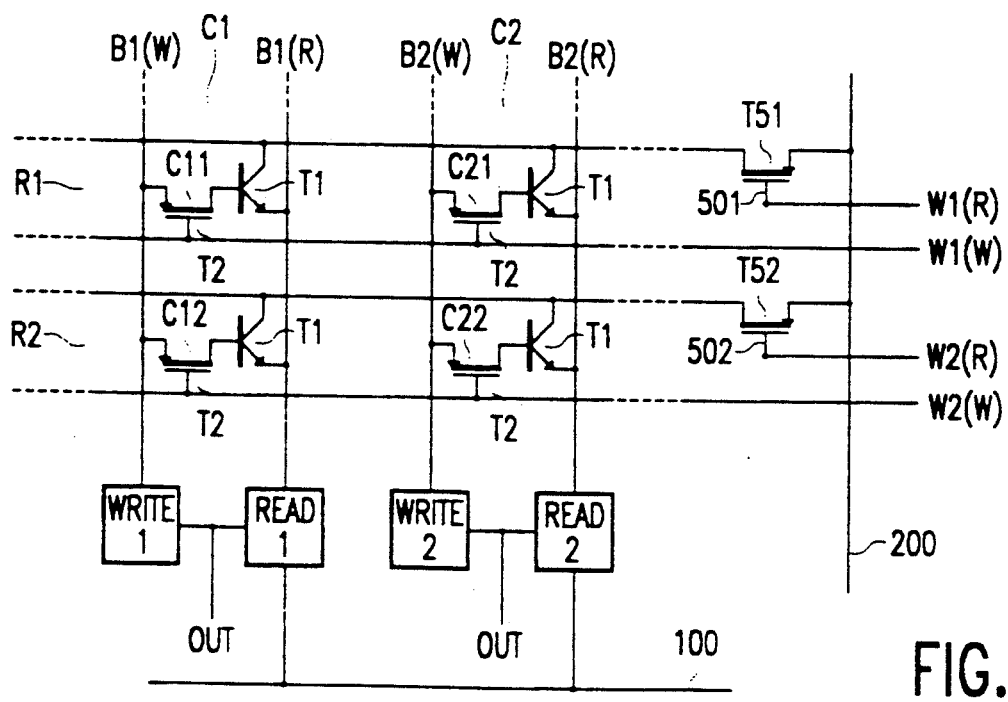
FIG. 6 is an equivalent circuit diagram of a further preferred embodiment of the device according to the invention.

The switchable load in addition provides the advantage that the memory cell according to the invention may be used in a simple and compact manner in a memory matrix. FIG. 6 shows an equivalent circuit diagram of a portion of a further embodiment of the device according to the invention in which the memory cell of FIG. 4 is used in such a matrix. The device comprises a number of similar memory cells C11 . . . C22 of which four are shown in the Figure. The cells are organized in a matrix of rows R1, R2 and columns C1, C2. The collectors of the cells within one row are connected to the second supply line 200 through a common switchable load in the form of a PMOS transistor $T_{51}$, $T_{54}$. The gate electrodes 501, 502 of the load transistors can be controlled each by means of a separate read word line W1(R), W2(R). Within a column, the emitters are coupled to common reading means (READ1, READ2) through a common read bit line B1(R), B2(R).

The device in addition comprises a number of separate write selection lines W1(W), B1(W), W2(W), B2(W). Within a row, the control electrodes of the control transistors $T_2$ are connected to a common write word line W1(W), W2(W); within a column the bases of the memory cells $T_1$ are each connected to a write bit line B1(W), B2(W) common to the column. The write bit line B1(W), B2(W) is controlled by writing means (WRITE1, WRITE2) common to a column.

The word lines W1(R), W2(R), W1(W), W2(W) are normally at a high voltage. For reading a cell, for example, cell C21, the read word line W1(R) associated with the relevant row R1 is brought to a low voltage, so that the switchable load $T_{51}$ controlled thereby switches to a low impedance. All memory cells C11, C12 in the relevant row now carry a high collector current $I_{READ}$, at least in as far as a logic "1" was programmed therein. The contents of the cell can now be determined by the reading means (READ2) common to the relevant column C2 through the read bit line B2(R) associated with the selected cell C21. If the high collector current $I_{READ}$ is detected here, the selected cell C21 contains a logic "1"; if on the other hand a low collector current is detected, a logic "0" was written into the cell. For an adequate distinction between the cells C21, C22, etc. of a column, the high collector current $I_{READ}$ must be greater than the sum of the collector currents of the remaining cells within the column. In a memory matrix of n rows and m columns, this sum is at most $n-1$ times the low collector current $I_{STAND-BY}$. This means that the difference in impedance between the two states of the switchable load must be at least a factor $n-1$. The MOS transistor used here as the switchable load switches between an impedance of approximately 6 $G\Omega$ and a few $k\Omega$, and is accordingly suitable for memories of the order of $10^6$ rows. Even larger memories are possible within the scope of the invention when the impedance ratio is chosen to be greater.

For writing the cell C21, the write bit line B2(W) associated with the cell is brought to a low or high level, depending on the desired cell state. Then the write word line W1(W) of the relevant cell is brought to a low voltage, so that the control transistor $T_2$ of the cell becomes conducting and the voltage of the write word line W1(W) is applied to the base of the memory transistor $T_1$. The control transistors $T_2$ of the other memory cells C11 etc. in the same row, however, are now conducting as well. To prevent that these cells are written parasitically through their write bit lines B1(W), these write bit lines B1(W) are first brought to the same logic level as read on their read bit lines B1(R). To this end, the read word line W1(R) of the relevant row R1 is brought to a low voltage and subsequently the output voltage of the reading means (READ1, READ2) is coupled to the write bit line B1(W), B2(W) in every column C1, C2, possibly through a level shifter circuit. The write bit line B2(W) of the selected cell C21 is forced to the desired logic level by the associated writing means (WRITE2). Only then is the write word line W1(W) controlled to a low potential. For writing, accordingly, first a reading operation and only then a writing operation is carried out, so that writing always involves at the same time a refreshing of the memory states of the other cells within the row.

Although the invention was explained above with reference to selected embodiments, it will be apparent that the invention is by no means limited to the examples given. Many more variations are possible to those skilled in the art within the scope of the invention. Thus the conductivity types given may be replaced by the opposite conductivity types. Furthermore, the control transistor and the load transistor in the device need not be p-channel MOS transistors; alternative types of field effect transistors, for example NMOST or JFET, or even a bipolar transistor may be used.

Generally speaking, the invention provides a semiconductor device with a memory cell which can be integrated in a compact manner and renders a comparatively high reading speed possible. In a special embodiment, the invention gives the device in addition a comparatively low power consumption as well as the possibility of organizing the memory cell in a compact manner in a memory matrix.

We claim:

1. A semiconductor device comprising a semiconductor body provided with a programmable memory cell which comprises a bipolar transistor with an emitter and a collector of a first conductivity type mutually separated by a base of a second, opposite conductivity type, the emitter and the collector being coupled to a first and a second supply line, respectively, and the base being coupled to writing means through at least a control transistor provided with a control electrode, characterized in that the memory cell is coupled to reading means which are included in a current path which extends between the first and the second supply line and which comprises a current path between the emitter and the collector of the bipolar transistor, the reading means being connected between the emitter and the first supply line.

2. A semiconductor device as claimed in claim 1, characterized in that the collector is coupled to the second supply line through a switchable load, and in that the load is provided with switching means for switching the load between a comparatively high and a comparatively low value.

3. A semiconductor device as claimed in claim 2, characterized in that the switchable load comprises a field effect transistor having a source and a drain between which the electric conductivity is controllable by means of a gate electrode, and in that the gate electrode forms the switching means.

4. A semiconductor device as claimed in claim 2, characterized in that the device comprises, in addition to the memory cell, a number of similar further memory cells, which memory cells are organized in a memory matrix comprising rows and columns, in that the collectors of the cells within a row are coupled to the second supply line through a common load, in that the switching means of the common load of a row of memory cells are coupled to a first read selection line, in that the emitters of the memory cells within a column are coupled to a second read selection line, and in that the read selection line is coupled to reading means which are common to a column of memory cells.

5. A semiconductor device as claimed in claim 4, characterized in that the memory matrix comprises separate write selection lines, in that the control electrodes of the control transistors within a row of memory cells are coupled to a first write selection line, and in that the bases of the memory cells within a column of memory cells are coupled to a second write selection line and to common writing means.

6. A semiconductor device as claimed in claim 5, characterized in that the second read selection line has a feedback line to the second write selection line within a column of memory cells.

* * * * *